United States Patent
Busker et al.

(10) Patent No.: US 11,658,490 B2
(45) Date of Patent: May 23, 2023

(54) WIND ENERGY SYSTEM AND METHOD FOR IDENTIFYING LOW-FREQUENCY OSCILLATIONS IN AN ELECTRICAL SUPPLY NETWORK

(71) Applicant: Wobben Properties GmbH, Aurich (DE)

(72) Inventors: Kai Busker, Großefehn (DE); Angelo Mendonca, Wilhelmshaven (DE); Aramis Schwanka Trevisan, Aurich (DE)

(73) Assignee: Wobben Properties GmbH, Aurich (DE)

( * ) Notice: Subject to any disclaimer, the term of this patent is extended or adjusted under 35 U.S.C. 154(b) by 123 days.

(21) Appl. No.: 17/258,130

(22) PCT Filed: Jul. 5, 2019

(86) PCT No.: PCT/EP2019/068107
§ 371 (c)(1),
(2) Date: Jan. 5, 2021

(87) PCT Pub. No.: WO2020/008036
PCT Pub. Date: Jan. 9, 2020

(65) Prior Publication Data
US 2021/0159705 A1    May 27, 2021

(30) Foreign Application Priority Data
Jul. 6, 2018   (DE) .......................... 10 2018 116 446

(51) Int. Cl.
*H02J 3/46*   (2006.01)
*H02J 3/38*   (2006.01)
(Continued)

(52) U.S. Cl.
CPC .............. *H02J 3/381* (2013.01); *G05B 15/02* (2013.01); *H02J 3/241* (2020.01); *H02J 3/46* (2013.01); *H02J 2300/28* (2020.01)

(58) Field of Classification Search
None
See application file for complete search history.

(56) References Cited

U.S. PATENT DOCUMENTS 4,607,217 A * 8/1986 Bhargava ............... G01R 23/02
322/29
2009/0194995 A1* 8/2009 Delmerico ............. H02J 3/381
290/44

(Continued)

FOREIGN PATENT DOCUMENTS

DE    102014200740 A1   7/2015
WO    2012/019613 A1    2/2012
WO    2013/102791 A1    7/2013

OTHER PUBLICATIONS

Abdou et al., "Damping of Subsynchronous Oscillations and Improve Transientstability for Wind farms", 2011, IEEE. (Year: 2011).*

(Continued)

*Primary Examiner* — Mohammad Ali
*Assistant Examiner* — Kelvin Booker
(74) *Attorney, Agent, or Firm* — Seed IP Law Group LLP

(57) ABSTRACT

Provided is a method for identifying low-frequency oscillations, in particular subsynchronous resonances, in an electrical supply network, wherein the electrical supply network has a line voltage with a nominal line frequency, comprising the steps: detecting at least one electrical signal of the electrical supply network as at least one test signal and filtering and/or transforming the at least one detected test signal into at least one check signal, temporal derivation of the at least one check signal or difference formation of temporally separated values of the check signal, in order to (Continued)

obtain a gradient signal in each case, identifying the presence of a low-frequency oscillation if the gradient signal or at least one of the gradient signals meets a predetermined check criterion, in particular at least one predetermined check limit is exceeded.

19 Claims, 5 Drawing Sheets

(51) Int. Cl.
*G05B 15/02* (2006.01)
*H02J 3/24* (2006.01)

(56) References Cited

U.S. PATENT DOCUMENTS

| | | | | |
|---|---|---|---|---|
| 2011/0211951 | A1* | 9/2011 | Kooijman | F03D 7/04 416/31 |
| 2012/0205912 | A1* | 8/2012 | Wakasa | F03D 7/0284 290/44 |
| 2014/0148962 | A1* | 5/2014 | Venayagamoorthy | H02J 3/00 700/286 |
| 2015/0137519 | A1* | 5/2015 | Tarnowski | H02J 3/381 290/44 |
| 2016/0141991 | A1* | 5/2016 | Khalili Nia | H02J 3/241 322/19 |
| 2016/0336888 | A1 | 11/2016 | Busker | |
| 2018/0017604 | A1* | 1/2018 | Daw | G01R 23/167 |
| 2018/0128243 | A1* | 5/2018 | Deng | G05B 19/048 |
| 2018/0138709 | A1* | 5/2018 | Hamann | F03D 7/0296 |
| 2018/0335020 | A1* | 11/2018 | Ayiranazhi Cailakam | F03D 9/257 |

OTHER PUBLICATIONS

Edrah et al., "Reactive power control of DFIG wind turbines for power oscillation damping under a wide range of operating conditions", Jan. 2016, IET Generation, Transmission & Distribution, IET Jounals. (Year: 2016).*
Fan et al., "On Active/Reactive Power Modulation of DFIG-Based Wind Generation for Interarea Oscillation Damping", Jun. 2011, IEEE Transactions on Energy Conversion, vol. 26, No. 2. (Year: 2011).*
Choudhary et al., Small Signal Stability Analysis of Renewable Source Connected Power System and Identification of Oscillatory Modes Using Wavelet Transform,2015, 2015 Int. Conf. on Smart Grid and Clean Energy Technologies. (Year: 2015).*
Adamczyk, "Control of Full-Scale Converter Based Wind Power Plants for Damping of Low Frequency System Oscillations", 2011, 2011 IEEE Trondheim PowerTech. (Year: 2011).*
Dominguez-Garcia et al., "Power oscillation damping supported by wind power: A review", Jul. 2011, Renewable and Sustainable Energy Reviews 16(2012) 4994-5006. (Year: 2011).*
Leon et al., "Power Oscillation Damping Improvement by Adding Multiple Wind Farms to Wide-Area Coordinating Controls", May 2014, IEEE Transactions on Power Systems, vol. 29, No. 3. (Year: 2014).*
Hui, "Damping control strategies of inter-area low-frequency oscillation for DFIG-based wind farms integrated into a power system", Sep. 2013, Electrical Power and Energy Systems 61 (2014) 279-287. (Year: 2013).*
Ngamroo, I., "Review of DFIG Wind Turbine Impacton Power System Dynamic Performances", Sep. 2016, IEEJ Transactions on Electrical and Electronic Engineering IEEJ Trans 2017; 12: 301-311. (Year: 2016).*
Miao et al., "Control of DFIG-Based Wind Generation to Improve Interarea Oscillation Damping", Feb. 2008, IEEE Transactions on Energy Conversion, vol. 24, No. 2, Jun. 2009. (Year: 2008).*
Zhao et al., "An Optimal Reactive Power Control Strategy for a DFIG-Based Wind Farm to Damp the Sub-Synchronous Oscillation of a Power System", Feb. 2014, Energies 2014, 7, 3086-3103; doi:10.3390/en7053086. (Year: 2014).*
Shi-ping et al., "Study on Transient Power Quality Detection of Grid-Connected Wind Power Generation System Based on Wavelet Transform", 2009, 2009 International Conference on Energy and Environment Technology. (Year: 2009).*
Ngamroo, "Review of DFIG Wind Turbine Impact on Power System Dynamic Performances", Sep. 2016, IEEJ Transactions On Electrical and Electronic Engineering IEEJ Trans 2017; 12: 301-311. (Year: 2016).*
Choudhary et al. "Small Signal Stability Analysis of Renewable Source Connected Power System and Identification of Oscillatory Modes Using Wavelet Transform", 2015, 2015 International Conference on Smart Grid and Clean Energy Technologies. (Year: 2015).*

\* cited by examiner

WIND ENERGY SYSTEM AND METHOD FOR IDENTIFYING LOW-FREQUENCY OSCILLATIONS IN AN ELECTRICAL SUPPLY NETWORK

BACKGROUND

Technical Field

The present invention relates to a method for identifying low-frequency oscillations, in particular subsynchronous resonances, in an electrical supply network. The invention also relates to a wind energy system, that is to say a wind power installation or a wind farm with a plurality of wind power installations, for carrying out a method for identifying low-frequency oscillations, in particular subsynchronous resonances, in an electrical supply network.

Description of the Related Art

Wind energy systems, that is to say wind power installations or wind farms, are known and they produce electrical power from wind and feed it into an electrical supply network. The proportion of electrical power which is fed into the electrical supply network by way of the wind energy systems, out of the total power fed into the electrical supply network, is increasing these days in most electrical supply networks. Wind energy systems of this type are therefore increasingly important for supporting the electrical supply network.

One problem area in which support from wind energy systems would be beneficial is the occurrence of low-frequency oscillations. As far as these low-frequency oscillations are oscillations between two elements or areas in the electrical supply network, they can also be called subsynchronous resonances. In any case, low-frequency oscillations, including subsynchronous resonances can in particular be caused by the oscillation behavior of one or a plurality of synchronous generators directly coupled with the electrical supply network.

While conventional large power stations, which have synchronous generators of this type which are directly coupled with the electrical supply network, counteract an effect of this type by optionally setting or controlling their directly coupled synchronous generators, particularly also taking into account the physical properties of the directly coupled synchronous generator being used in each case, modern wind energy systems in principle feed into the electrical supply network by means of frequency inverters or frequency converters. Physical effects of the directly coupled synchronous generator as a response to changes in the network, which can directly influence current and voltage, as they are known from synchronous generators which are directly coupled with the electrical supply network, do not occur when feeding by means of inverters or frequency converters. Instead, the current fed in can substantially be specified according to amount, frequency and phase by feeding by means of an inverter.

For wind energy systems which feed into the electrical supply network by means of inverters, it is instead particularly important to detect any low-frequency oscillations which are to be damped. It should at least be detected whether low-frequency oscillations occur at all.

However, particularly in the case of low-frequency oscillations, the low frequency of the oscillations can also result in low-frequency oscillations of this type only being able to be detected or identified at a late stage or a long evaluation period being made necessary.

In principle, methods are known in order to detect superimposed oscillations of lower frequency in a 50 Hz signal or 60 Hz signal. However, in practice, a low amplitude of superimposed low-frequency oscillations of this type particularly results in poor identifiability. In particular if there is little time available for identifying, known frequency analysis methods can be pushed to their limits.

In the priority application for the present PCT application, the German Patent and Trademark Office has researched the following prior art: DE 10 2014 200 740 A1 and WO 2013/102791 A1.

BRIEF SUMMARY

Proposed herein is quick identifiability of low-frequency oscillations in the electrical supply network for wind energy systems.

A method for identifying low-frequency oscillations in an electrical supply network is proposed. In particular, subsynchronous resonances are to be identified as low-frequency oscillations, but other low-frequency oscillations are also possible. In this case, an electrical supply network is assumed which has a line voltage with a nominal line frequency. The low-frequency oscillations which are to be identified have a lower frequency than the nominal line frequency. The low-frequency oscillations therefore preferably have a lower frequency than the fundamental frequency of the electrical supply network.

In particular, the low-frequency oscillations can have values of 1 Hz and less. However, they can also reach up to five times the value of the nominal line frequency. Oscillations with a frequency of a maximum of five times the value of the nominal line frequency are here referred to as low-frequency oscillations, preferably with a frequency which corresponds to no more than the nominal line frequency. In particular, the low-frequency oscillation does not have a frequency which corresponds to a multiple of the nominal line frequency. It should be noted that examining and taking into account low-frequency oscillations particularly serves to examine or ensure system stability of the electrical supply network. This is different from assessing the network quality or signal quality of the voltage signal in the electrical supply network, in the case of which harmonic waves are particularly important.

It is now proposed that at least one electrical signal of the electrical supply network is detected as at least one test signal. In particular, an electrical voltage and additionally or alternatively an electrical current is considered as an electrical signal. In this case, particularly a three-phase voltage can be received at a network connection point as an electrical voltage, or an electrical voltage which is equivalent, in particular proportional, to the electrical voltage at the network connection point. This is possible in particular if a wind energy system, that is to say a wind power installation or a wind farm, is used for identifying the low-frequency oscillations, which is also proposed. This wind energy system can feed into the electrical supply network at a network connection point and detect the voltage there. For this purpose, a transformer is also typically used, in order to boost the voltage from the wind energy system to the level in the electrical supply network. The electrical voltage of the low-voltage side of the transformer can also be used here. An output voltage at an inverter can regularly also be a voltage which is representative of the line voltage, namely particularly the electrical voltage at the network connection point of the electrical supply network.

In particular, the electrical current which is fed into the electrical supply network is used as an electrical current. This current is also preferably received in three phases. In this case, this electrical current which is fed into the electrical supply network can in particular be an electrical current produced by the wind energy system.

According to a further step, it is proposed that the at least one detected test signal is filtered and/or transformed into at least one check signal. In particular, such a filtering or transforming is considered here in which the fundamental frequency of the test signal is also filtered, that is to say ideally eliminated, in addition to measurement noise. The nominal line frequency is to be regarded here as a fundamental frequency, i.e., typically a frequency of 50 Hz or 60 Hz. However, instead or additionally, it is also possible to transform the test signal in such a way that there results the temporal course of the effective value. This ideally results in a check signal, the amplitude of which substantially constantly has the value of the effective value. This amplitude can then fluctuate if an additional signal is superimposed on the fundamental wave. In particular, a low-frequency signal can be superimposed here which can result in a minor fluctuation. The detected variables are preferably transformed into space vector variables and the space vector variables transformed in this way are then further used, in particular further filtered. In particular, variables of this type can also be constant at a constant operating point. However, if low-frequency oscillations occur, they can be reflected in changes to these detected variables, particularly in changes to the respective space vector variable.

In a further step, it is proposed that the at least one check signal is temporally differentiated in order to obtain a gradient signal in each case. If the check signal reproduces the effective value of the test signal, for example, the derivative of a check signal of this type would ideally be 0, if, that it to say, the test signal were ideally sinusoidal and without fluctuations. However, if at least one low-frequency oscillation is superimposed, it can emerge as a result of the temporal differentiation of the check signal. The gradient signal obtained by way of the temporal differentiation then not only has the value 0, but substantially shows the derivative of the superimposed signal.

For this purpose, it is now proposed that the presence of a low-frequency oscillation is identified if the gradient signal or at least one of the gradient signals, if a plurality of test signals have been processed, meets a predetermined check criterion. In particular, it is proposed that the check criterion is a check limit which can be specified, and that the check criterion is met if this predetermined check limit is exceeded.

The evaluation therefore ultimately takes place by evaluating the gradient signal. The temporal derivative is therefore checked from the at least one filtered or transformed test signal and if it exceeds a check limit at least for the check signal of one of the signals, the presence of a low-frequency oscillation is assumed.

Whether a low-frequency oscillation is present is therefore firstly identified via the gradient formation. In particular, the gradient formation is not applied to an oscillation which is already identified, in order to identify, for example, whether the oscillation increases or decreases, but rather the oscillation is actually firstly identified by the gradient formation. In particular, the comparison of the gradients detected in this way with a check limit forms a check for absolute values. An oscillation is then therefore already assumed if this check limit is exceeded. It is not necessary to consider the further development of the oscillation. This also makes a quick identification possible, since one single exceeding of the check limit can be sufficient as an identification of the oscillation. The criterion is therefore also easily implemented.

In particular, this method is therefore also good for online use. Values can be continuously received, the at least one electrical test signal can therefore be continuously detected and it can also be continuously filtered or transformed and this can in turn be continuously differentiated with respect to time. This derivative, i.e., this derivative signal can be constantly subject to the check criterion, in particular a comparison of this gradient signal with a predetermined check limit can constantly take place. Meeting the check criterion, in particular exceeding the check limit can thus immediately trigger an action. In particular, a support measure can be triggered immediately as a result. For example, a power feed-in can be reduced immediately. It is also possible that a controller parameterization is then changed immediately, namely from a controller with a low time constant and/or weakly damped behavior to a controller with a greater time constant and/or more strongly damped behavior.

The gradient signal can also be obtained by carrying out a difference formation of temporally separated values of the check signal. As far as a digital check signal is present, the difference formation between each sample value in any case corresponds to the temporal differentiation. However, it is also possible here that a difference formation is performed for a predetermined difference period, which is preferably greater than a sampling interval. A difference formation of this type can correspondingly be repeated successively. Difference formations of this type are preferably carried out in predetermined time windows. In particular, this also makes it possible to suppress noise. A difference formation of this type in time windows can act like a filtering and can be set by the size of the time window.

Particularly when checking whether a predetermined check limit is exceeded, a difference of this type of two temporally separated values can be directly compared with the check limit. A quick identification of a low-frequency oscillation is therefore also possible in principle, since a decision can be made directly after the difference formation as to whether the presence of a low-frequency oscillation is in fact assumed.

According to an embodiment, it is proposed that a gradient maximum value is specified as a check criterion and the presence of the low-frequency oscillation is identified if the gradient signal exceeds the gradient maximum value at least once. This makes it possible to specify a clear check criterion. In particular, it is proposed that the presence of the low-frequency oscillation is identified if the gradient signal is above the gradient maximum value at least for a predetermined minimum period. The duration of one or two sampling steps can already be selected here as a predetermined minimum period. The presence of the low-frequency oscillation is then only actually identified if the gradient signal is above the gradient maximum value at least for two measured values, or at least for three measured values. This makes it possible to prevent one single exceeding value, which substantially results from a measurement noise, from already triggering the identification of a low-frequency oscillation.

By checking for a gradient maximum value, a corresponding oscillation can be identified immediately, as soon as the gradient, which is representative of the oscillation amplitude, actually exceeds this value. A criterion of this type thus differs from a method which detects an oscillation and considers the further development of the oscillation, which in fact considers whether the oscillation increases, decreases or stagnates.

A difference of this type becomes particularly clear with an oscillation which occurs abruptly, for example as a result of a power jump of a power fed in. This makes it possible for an oscillation to suddenly occur which, however, decreases again. If the method for identifying the oscillation considers the further development of the oscillation, it identifies that the oscillation decays and therefore does not identify an oscillation and therefore does not trigger an identification signal. However, if reaching or exceeding an absolute value is considered, such as the gradient maximum value, the oscillation would be identified in the case mentioned. Criteria of this type therefore differ significantly.

The gradient maximum value can also depend on a check period over which the gradient is formed and which will be described hereinafter. The gradient maximum value is preferably also selected with regard to the check period in such a way that it corresponds with a maximum oscillation amplitude of the electrical signal to be checked. For the line voltage as the signal to be checked, the gradient maximum value is preferably selected from a range which corresponds to a range of 0.1% to 2% of the corresponding maximum oscillation amplitude. According to one embodiment, it is proposed that a difference between a maximum and minimum value of the check signal in a considered check period is used as a gradient signal. Accordingly, a check period is therefore specified in which the gradient signal is considered. For this purpose, the difference of two values which are separated by a predetermined temporal distance is not considered, but rather the minimum and maximum value, occurring in this check period, of the check signal is considered and their difference is used as a gradient signal, in particular compared with a predetermined check limit. For example, it is possible that the check period is selected in such a way that there are 10 or more values or in particular up to 50 values of the gradient signal therein. This makes it possible to establish a clearly defined check criterion and, in the case of a high sampling rate, the period until which the check criterion is checked is comparatively short. The check period being considered is preferably used as a sliding window and in particular with every new sampling step it is thus shifted one sampling step further and the check signal which is then in the window is correspondingly evaluated.

It should be noted that a check limit, particularly for an oscillation amplitude, can be taken as a basis. The check limit is therefore preferably not compared with an absolute value, but rather it is compared with a maximum oscillation amplitude. An oscillation amplitude of this type in principle describes the distance of a positive and a negative envelope of an oscillating signal. If a signal therefore fluctuates, for example, around a value of 10, to name only one example, and if the signal oscillates here, in the most extreme case, from the value 9 to the value 11 and back, the oscillation amplitude would have the value 2 in this example. If, to remain with this illustrative example, the associated check limit were the value 3, for example, this check limit would not be reached. However, if the value of the check limit were 1.5, for example, it would be reached.

According to one embodiment, it is proposed that a line voltage of the electrical supply network is detected as a first test signal, in particular in three phases, and a feed current fed into the electrical supply network is detected as a second test signal, in particular in three phases, and in particular the first and second test signal are transformed into at least one check signal. Via the line voltage, in particular at the relevant network connection point, and the feed current fed in, which in particular a wind energy system feeds into the electrical supply network, information about low-frequency oscillations can be detected, which was thus identified. In particular, it should be taken into account in this case that a low-frequency oscillation may also regularly affect the oscillating back and forth of electrical power in the electrical supply network. The power fed in or also the reactive power fed in can therefore be detected by detecting the feed current and simultaneously detecting the line voltage, i.e., detecting the voltage with which the feed current is fed in. The oscillation of power in the electrical supply network can in turn be derived therefrom or it can be detected as a result.

This detected line voltage and this detected feed current fed in are preferably transformed into at least one check signal. In this case, it is also possible that they are transformed into a common check signal or are transformed together into a plurality of check signals. In particular, a transformation into an active power signal as a check signal and/or a reactive power signal as a check signal is possible.

A first and second test signal of this type, i.e., the detected line voltage and the detected feed current fed in, are preferably transformed into a voltage signal, an active power signal and a reactive power signal, which then form a voltage check signal, active power check signal or reactive power check signal.

The voltage signal then therefore represents the line voltage, the active power signal the active power fed in and the reactive power signal the reactive power fed in.

These three check signals are then each temporally differentiated, in order to obtain a gradient signal in each case, namely a voltage gradient signal, an active power gradient signal and reactive power gradient signal. The temporal derivative can also be realized in each case by way of a difference formation, or a difference formation of temporally separated values is carried out instead of the temporal derivative.

The voltage gradient signal, the active power gradient signal and the reactive power gradient signal are then checked for the presence of a low-frequency oscillation.

The check takes place in particular such that the presence of a low-frequency oscillation is assumed if a low-frequency oscillation has been identified at least in the voltage gradient signal and the active power gradient signal, or if a low-frequency oscillation has been identified in the voltage gradient signal and the reactive power gradient signal. It is also possible that the presence of a low-frequency oscillation is assumed if a low-frequency oscillation has been identified in all three gradients, i.e., if a low-frequency oscillation has been identified in the voltage gradient signal, in the active power gradient signal and in the reactive power gradient signal.

In particular, positive checking of the presence of a low-frequency oscillation in at least two of the gradient signals mentioned prevents a measuring error or a noise that is too strong from already resulting in an incorrect identification of low-frequency oscillations. In particular, simultaneous checking in the voltage gradient signal on the one hand and the active power gradient signal or the reactive power gradient signal on the other hand has been recognized as advantageous, since the voltage gradient signal can identify fluctuations in the voltage signal quickly, which fluctuations, however, may not be related to low-frequency oscillations. By further taking into account the reactive or active power, the current component is thus also taken into account and not only voltage fluctuations are identified, which could also have another cause and do not necessarily have to immediately indicate a low-frequency oscillation.

According to an embodiment, it is proposed that a line frequency of the electrical supply network is detected as a further test signal, the further test signal is transformed into a frequency signal as a frequency check signal, and the frequency check signal is temporally differentiated, or a difference is formed, in order to obtain a frequency gradient signal. The frequency gradient signal and in particular at least one further gradient signal are then checked for the presence of a low-frequency oscillation, in particular such that the presence of a low-frequency oscillation is assumed if a low-frequency oscillation has been identified in the frequency gradient signal and in at least one more of the gradient signals, that is to say in a voltage gradient signal, an active power gradient signal and/or a reactive power gradient signal.

It is therefore proposed here that the line frequency as such is detected and evaluated as a signal. A signal of this type would ideally be constant, particularly at 50 Hz or 60 Hz. However, it will in fact fluctuate and this fluctuation forms, illustratively speaking, the frequency signal. A frequency signal of this type can then essentially be further processed like the other signals described.

It is also possible here to not only evaluate the frequency signal but to also take into account at least one further signal, particularly the active power gradient signal. The detection of the low-frequency oscillation can therefore be additionally guaranteed. The transformation of the detected voltages and currents among other things into an active power signal and a reactive power signal as check signals also makes it possible in particular to take into account these variables as effective values. In particular, a transformation can take place into their respective effective values and then particularly only the fluctuation of the effective values is considered by their derivative.

According to one embodiment, it is proposed that, for detecting the at least one electrical signal of the electrical supply network as a test signal, a three-phase line voltage is detected and a direct variable, in particular a space vector variable of the voltage, is formed from it via a transformation, in particular that a positive sequence voltage is determined according to the method of the symmetrical components, which forms a check signal and/or a three-phase feed current is detected as a test signal and a positive sequence current is determined from it according to the method of the symmetrical components, which forms a check signal.

A direct variable, i.e., a non-oscillating variable, which can thus also be referred to as a DC variable, which in principle describes a sinusoidal signal through a fixed variable, is thus determined as a result of the transformation. As a result, the signal is substantially freed from its oscillating base signal and thus signal changes, namely deviations from the sinusoidal base signal, emerge strongly and can therefore be identified easily and optionally processed. Despite three examined phases, only one variable needs to be considered. These effects and the resulting advantages also arise with a corresponding transformation of a three-phase input current, for which a transformation of this type is therefore also proposed. In particular, a transformation according to the method of the symmetrical components is proposed for the line voltage and/or the feed current in each case as a transformation into a check signal, wherein only the positive sequence component, i.e., in principle the symmetrical component, is then considered. In this case, it has been particularly recognized that in principle an effective value results from this transformation according to the method of the symmetrical components, which effective value is therefore an equivalent value and it can be used effectively as a description of the basic component. Actual fluctuations, particularly power fluctuations, which are not limited to asymmetries, are then in each case superimposed on this symmetrical component and can then be easily identified by the proposed temporal differentiation of these check signals.

As a result of the transformation into a positive sequence voltage and a positive sequence current, the three-phase voltage or the three-phase current is in each case also considered as only one component in a simple manner and in a manner which is known from other applications. Particularly for the further processing and later application of a check criterion, the question of how to apply one individual criterion to three phases does not then arise.

It has also been recognized that a transformation of this type, particularly a transformation into a positive and negative sequence component, has a filtering effect and therefore particularly high-frequency components are filtered out and a bandwidth which is sufficient for the identification of low-frequency signals is provided. However, other transformations are also possible, such as a d/q transformation, which may also result in an equivalent value if the reference frequency is selected correspondingly.

The direct variable or space vector variable of the voltage or the positive sequence voltage and the direct variable or space vector variable of the current or the positive sequence current is preferably transformed into a voltage signal, an active power signal and reactive power signal as a voltage check signal, active power check signal or reactive power check signal. In this respect, the positive sequence voltage can directly form the voltage check signal. The positive sequence current, together with the positive sequence voltage, can be further transformed into an active power signal and a reactive power signal.

This further transformation, particularly also for obtaining the active power check signal and reactive power check signal, makes it possible to consider in a simple and efficient manner the powers fed in, particularly their fluctuations can then be considered, particularly by the proposed temporal derivative or difference formation of the respective check signal.

Feeding into the electrical supply network is preferably carried out by means of a wind power installation or a wind farm and identifying low-frequency oscillations is carried out by means of the wind power installation or by means of the wind farm. It has been particularly recognized here that a wind power installation or a wind farm can act as very fast control units in the electrical supply network and it can therefore be advantageous to also use them for detecting low-frequency oscillations. Details of wind power installations or wind farms of this type will be described hereinafter.

According to one embodiment, it is proposed that an oscillation caused in the electrical supply network is identified if a low-frequency oscillation has been identified in the voltage gradient signal and the active power gradient signal or in the voltage gradient signal and the reactive power gradient signal in each case, and these identified low-frequency oscillations have the same oscillation frequency, wherein in particular it is additionally checked whether the line frequency oscillates with the same oscillation frequency.

It has been particularly recognized here that a low-frequency oscillation can have different causes and that how such oscillations are to be dealt with can also depend on this. If a feeder, particularly a wind power installation or a wind farm, has caused the oscillations, the reason of the oscillation is therefore to be found particularly in the dynamics of the wind power installation or the wind farm. It should then also be assumed from this that the wind power installation or the wind farm must be able to resolve the oscillations. The reason for the oscillation then does not also necessarily have to be directly in the area of the feed-in, but rather it can also relate to a mechanical oscillation and/or an oscillation in the generator.

However, if the cause of the oscillation is in the electrical supply network, the wind power installation or the wind farm will most likely, if anything, be able to be used for carrying out an oscillation damping, i.e., reduction. A damping of this type will also substantially affect the feed-in. Distinguishing the cause of the oscillation has therefore been recognized as being important.

For this purpose, it has been further recognized that when simultaneously detecting at least two of the signals mentioned, the cause of the oscillations is to be found in the electrical supply network. In particular, oscillations of the line voltage and the line frequency point to an oscillation in the electrical supply network, whereas the active power signal, i.e., the active power fed in, and the reactive power signal, i.e., the reactive power fed in, rather point to oscillations in the feeder unit, particularly in the wind power installation or the wind farm.

If the oscillations of the line voltage and/or the line frequency have the same oscillation frequency as the oscillations of the active and/or reactive power, there is an oscillation present which affects the feeder unit, particularly the wind power installation or the wind farm, but has its cause in the electrical supply network. For example, it may be the case that large electrical consumers which are connected to the electrical supply network disturb the network operation, for example as a result of power fluctuations and therefore trigger the oscillations.

According to a further configuration, the method is characterized in that a difference between a maximum and minimum value of the corresponding check signal in a considered check period is used as a voltage gradient signal, active power gradient signal and reactive power gradient signal in each case and an equal oscillation frequency is identified in that the same check period is used and/or respective time intervals between a maximum and minimum value of the corresponding check signal are the same or similar for the voltage gradient signal, the active power gradient signal or the reactive power gradient signal.

It has been particularly recognized here that the detection of the low-frequency oscillation by means of gradient formation can be carried out in a simple and efficient manner by way of difference formation of two signal values, namely the maximum and the minimum. This is based on a check period which can be set to the distance of the two values, i.e., the maximum and minimum value, and the oscillation frequency can also be formed directly as a result. However, this is also not necessary for a check for the same frequency, if the temporal distances are the same, the associated frequencies are also the same.

According to a further embodiment, the method is characterized in that a gradient quotient is formed as a quotient of two gradient signals and depending on the gradient quotient, an oscillation caused in the electrical supply network is identified. In particular, the wind power installation or the wind farm as a feeder unit is taken as a basis here, as also in particular in the preceding embodiments, and it is examined whether an oscillation caused in the electrical supply network or an oscillation caused in the or by the feeder unit is to be assumed.

By considering the gradient quotients, a simple check possibility is created which moreover can be implemented in a control unit or detection unit with little effort. In particular, it is proposed that a criterion of this type is implemented in a central farm control. In this case, two gradient signals can be directly related to one another, without a complex individual evaluation of the electrical signals or the gradient signals formed therefrom being necessary.

In particular, it is proposed that a voltage/active power quotient dV/dP is formed as a quotient between a voltage gradient signal and an active power gradient signal and/or that a voltage/reactive power quotient dV/dQ is formed as a quotient between a voltage gradient signal and a reactive power gradient signal. For this purpose, it is proposed that an oscillation caused in the electrical supply network is identified if the voltage/active power quotient dV/dP and/or the voltage/reactive power quotient dV/dQ are negative.

The underlying consideration here is that an oscillation of the active power P as well as the reactive power Q can result in a response, namely oscillation of the line voltage, since the line voltage also depends on these variables. In other words, if the active power and/or the reactive power oscillates, this can trigger a concurrent oscillation of the line voltage. This would result in, on the one hand, gradients of the same sign of the oscillation of the line voltage and, on the other hand, the oscillation of the active power or reactive power. The gradient quotient would therefore be positive.

However, if the oscillation of the line voltage V is not the result of the oscillation of the active power or reactive power, it is therefore to be expected that the line voltage, on the one hand, and the active power or reactive power, on the other hand, oscillate in opposite directions. Their gradients would then have different signs. The gradient quotient would be negative.

In the event that only one of the two quotients of the voltage/active power quotient dV/dP and of the voltage/reactive power quotient dV/dQ is negative, the quotient for which the denominator is greater can be decisive for the evaluation. However, the active power P and the reactive power Q usually do not oscillate against one another, so that they are fed in together as an apparent power S.

One further embodiment proposes a method that is characterized in that oscillations are classified, and a found oscillation classification is output. In particular, the following are considered as oscillation classifications:

A low-frequency oscillation has been identified for a or the line voltage signal and a or the active power signal.

A low-frequency oscillation has been identified for the line voltage signal and a or the reactive power signal.

A low-frequency oscillation has been identified for the voltage signal, the active power signal and the reactive power signal.

A low-frequency oscillation has been identified for the line frequency and also for the voltage signal, the active power signal and/or the reactive power signal.

It is therefore proposed that the oscillation classifications simply specify for which signals a low-frequency oscillation has been identified. Further qualified conclusions can then be derived therefrom by the receiver of this oscillation classification.

For example, an oscillation of the line voltage together with an oscillation of the active power fed in can point to a power oscillation in the electrical supply network or to an oscillation triggered by a change in the active power balance in the electrical supply network.

By contrast, an oscillation of the line voltage together with an oscillation of the reactive power fed in may rather point to a problem with voltage stabilization in the electrical supply network, to mention a further example.

A wind energy system is additionally proposed. The wind energy system can be an individual wind power installation or a wind farm with a plurality of wind power installations. It is prepared for identifying low-frequency oscillations, in particular subsynchronous resonances, in an electrical supply network. In the case of the electrical supply network, it is assumed that it has a line voltage with a nominal line frequency and that the low-frequency oscillations which are to be identified have a lower frequency than the nominal line frequency. The proposed wind energy system comprises a detection device for detecting at least one electrical signal of the electrical supply network as at least one test signal. In particular, a measuring device (sensor) is proposed here at the output of an inverter and/or at the network connection point at which the wind energy system feeds into the electrical supply network. The detection device is preferably set up to detect a voltage, in particular the line voltage of the electrical supply network. Additionally or alternatively, it is preferably proposed that the detection device is provided for detecting an electrical current fed in.

Furthermore, the wind energy system comprises a filter unit for filtering and/or transforming the at least one detected test signal into at least one check signal. In particular, a digital filter or a digital transformation unit is also possible here, in order to in particular filter or to transform the at least one test signal, if it is present as a digital signal. In particular, a filter is possible which filters out frequencies which are at and above the nominal line frequency, in order to in particular achieve that frequencies of the expected low-frequency oscillations are maintained. However, it is also possible in particular to carry out a transformation which also functions completely or partially as a filter, in order to in particular transform an effective value of the detected variable in each case. A transformation of this type into the effective value is considered in particular when detecting a line voltage or a current fed in as a test signal. The fundamental oscillation is therefore in principle filtered out or transformed out of the respective test signal.

Furthermore, a differentiation unit is provided for temporal differentiation of the at least one check signal, in order to obtain a gradient signal in each case. Each check signal is therefore changed into a gradient signal by way of this differentiation unit. Differentiation can also take place by way of a difference formation or a difference formation of temporally separated values of the check signal can be carried out instead of differentiation. For this purpose, a time interval can be specified, for example, by which two values of the check signal are to be separated if the difference formation is to be carried out between them. Ideally, only one derivative of any low-frequency oscillations which are present is then present in the gradient signal, if in fact the filter unit has ideally removed the base signal, i.e., in particular a 50 Hz signal or a 60 Hz signal. The respective signals, particularly the superimposed signals can be identified more easily by way of the derivative.

In addition, an identification unit is provided, for identifying the presence of a low-frequency oscillation. It operates in such a way that if the gradient signal or at least one of the gradient signals meets a predetermined check criterion, the presence of a low-frequency oscillation is identified. In particular, a check limit is specified as a predetermined check criterion and the check criterion is met if the at least one predetermined check limit is exceeded, in particular if a predetermined check limit has been exceeded by the gradient signal in each case.

The wind energy system, in particular the identification unit, therefore operates in such a way that low-frequency oscillations are identified by considering and evaluating the change in at least one filtered test signal.

The detection device, the filter unit, the differentiation unit and/or the identification unit can preferably be combined in one process computer and in particular in one control device (controller). In this case, it is also possible that these elements are each provided as program code.

In particular, the wind energy system operates in such a way that it implements a method according to at least one embodiment described previously.

In particular, the wind energy system has a control device and said control device is prepared to carry out a method according to an embodiment described previously. In particular, the method can be implemented in the control device for this purpose.

Provision is preferably made for a method for identifying low-frequency oscillations and/or a wind energy system for identifying low-frequency oscillations to also be prepared to respond in the event of one or a plurality of identified low-frequency oscillations, in particular to damp the electrical supply network. For this purpose, it is proposed that if the presence of a low-frequency oscillation has been identified, feeding of electrical power, in particular electrical active power, into the electrical supply network is reduced, in particular by 30%-70%, preferably 50%. It has been recognized that by reducing the active power fed in, the electrical supply network can be calmed with regard to low-frequency oscillations. It should be particularly emphasized here that detailed information regarding the identified low-frequency oscillation is not required for this. It is sufficient to perform, i.e., trigger, the proposed damping measure as soon as a low-frequency oscillation has been identified.

According to a further variant, provision is made to respond in the event of one or a plurality of low-frequency oscillations in such a way that a damping measure is activated in which a modulated power is fed in, for example.

It is preferably proposed, both for the method and for the wind power installation, that the decay of the one or plurality of identified low-frequency oscillations is assumed if the at least one gradient signal has fallen below a predetermined termination limit which is less than the check limit in each case. In particular, it is proposed that the termination limit is at least less than 80% of the check limit in each case, in particular less than 50% of the check limit in each case.

In this respect, it is proposed that the identification of the presence of a low-frequency oscillation is assumed if a predetermined check limit is exceeded but the decay of the low-frequency oscillation is not yet assumed if this predetermined check limit is fallen short of again. Instead, the gradient signal must be significantly less than the predetermined check limit and the predetermined termination limit is proposed for this, which is selected to be significantly less than the check limit. In particular, it should be at most 80%, preferably at most 50% of the check limit.

When checking a plurality of gradient signals, i.e., if a plurality of test signals have been received, an individual check limit can be provided for each gradient signal. Correspondingly, a plurality of termination limits must then also be assumed for identifying the decay of identified low-frequency oscillations, which termination limits are correspondingly individual. A check limit and a termination limit is preferably associated with each gradient signal, wherein the respective termination variable is less than the check limit of the same gradient signal.

It is preferably proposed that damping measures, which are triggered upon identifying a low-frequency oscillation, are terminated if the decay of the low-frequency oscillations is assumed. The damping measures can therefore be initiated if a gradient signal exceeds the predetermined check limit and they can be terminated if the same gradient signal falls below its termination limit.

BRIEF DESCRIPTION OF THE SEVERAL VIEWS OF THE DRAWINGS

The invention is explained in greater detail hereinafter by way of example using embodiments with reference to the accompanying figures.

DETAILED DESCRIPTION

Figure 1:
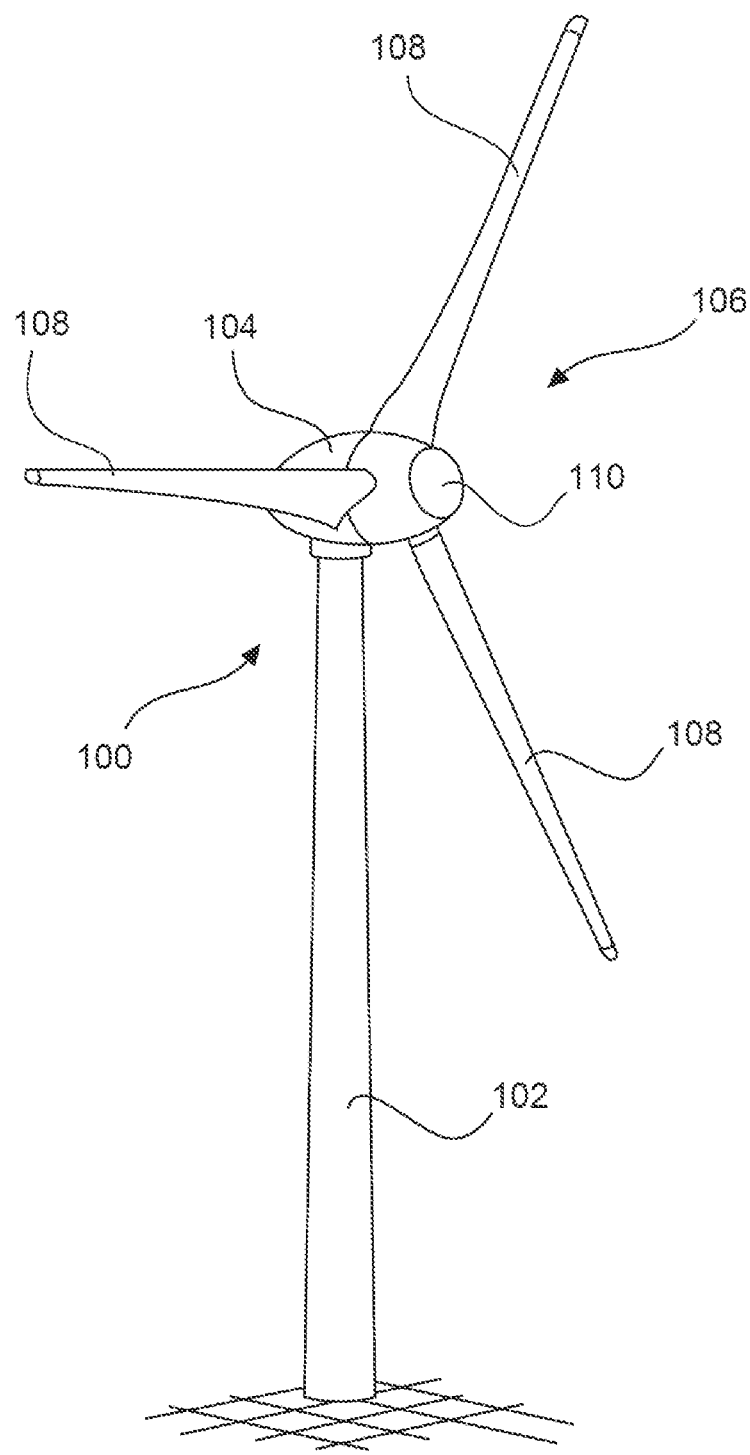
FIG. 1 shows a wind power installation in a perspective representation.

FIG. 1 shows a wind power installation 100 with a tower 102 and a nacelle 104.

A rotor 106 with three rotor blades 108 and a spinner 110 is arranged on the nacelle 104. The rotor 106 is transferred into a rotational movement by the wind during operation and thus drives a generator in the nacelle 104.

Figure 2:
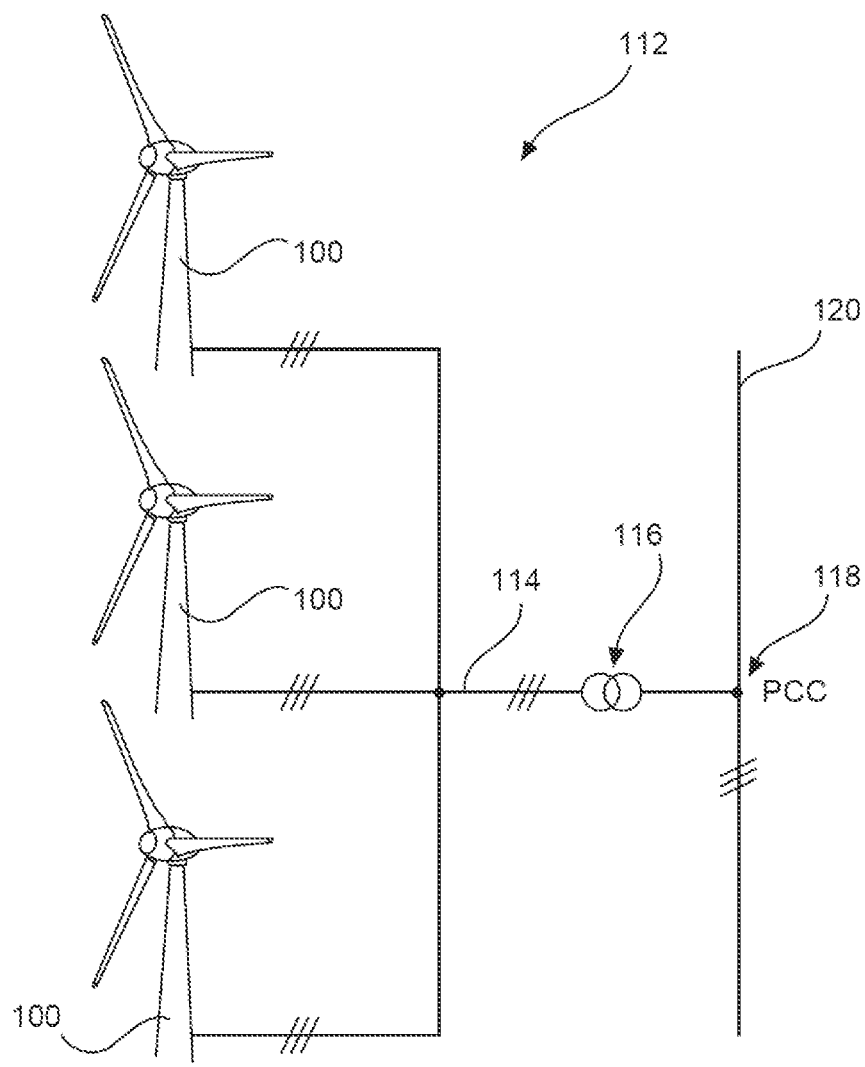
FIG. 2 shows a wind farm in a schematic representation.

FIG. 2 shows a wind farm 112 with three wind power installations 100 by way of example, which can be identical or different. The three wind power installations 100 are therefore representative of essentially any number of wind power installations of a wind farm 112. The wind power installations 100 provide their power, that is to say in particular the electricity produced via an electrical farm network 114. In this case, the currents or powers produced in each case from the individual wind power installations 100 are added up and a transformer 116 is usually provided which boosts the voltage in the farm, in order to then feed it into the supply network 120 at the feed-in point 118, which is also commonly referred to as PCC. FIG. 2 is merely a simplified representation of a wind farm 112 which does not show any control system, for example, even though a control system is of course present. The farm network 114 can also be configured differently, for example, by a transformer also being present at the output of each wind power installation 100, for example, to mention only one other exemplary embodiment.

Figure 3:
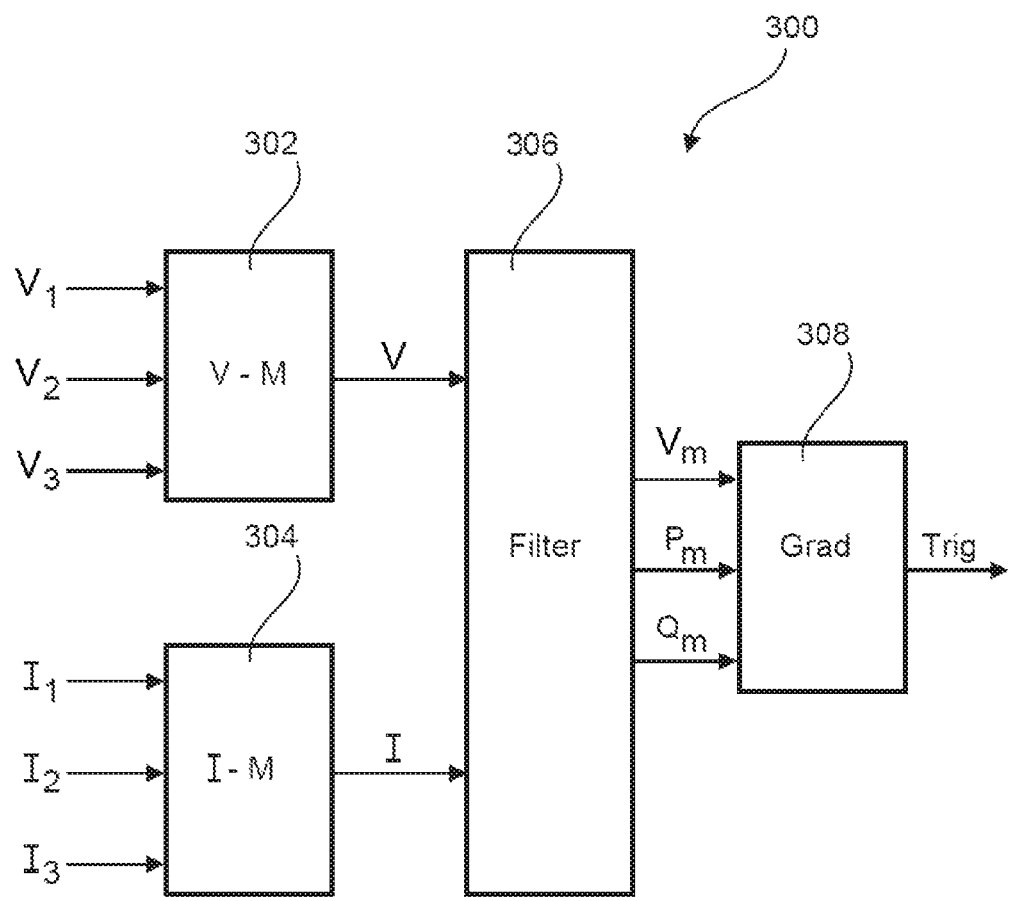
FIG. 3 schematically shows a flow structure of a method according to an embodiment.

In the flow structure 300, FIG. 3 shows method steps for the method for identifying low-frequency oscillations. A voltage detection block 302 and a current detection block 304 are firstly provided accordingly. The voltage detection block 302 receives the three phase voltages $V_1$, $V_2$ and $V_3$ and transmits a common voltage signal V to a filter block 306. In this case, the three phase voltages $V_1$, $V_2$ and $V_3$ may in particular have been received as a line voltage at a network connection point.

The current detection block 304 receives the three phase currents $I_1$, $I_2$ and $I_3$ and transmits a common current signal I to the filter block 306. The three phase currents $I_1$, $I_2$ and $I_3$ may in particular have been received as feed currents which a wind energy system has produced and feeds into the electrical supply network at the same network connection point at which the three phase voltages $V_1$, $V_2$ and $V_3$ were also detected.

The obtained common voltage signal V and the obtained common current signal I are then firstly filtered in the filter block 306. This filtering is adapted to the frequency spectrum of interest. In particular, the filter is designed in such a way that low-frequency oscillations can be maintained as far as possible and are not filtered out.

In addition, the signals filtered in this way are converted into a voltage effective value $V_m$, an active power effective value $P_m$ and a reactive power effective value $Q_m$ in the filter block 306. All of these three values are output as signals, i.e., as a voltage signal, active power signal and reactive power signal, wherein each signal reproduces the effective value of the relevant variable depending on the time. These signals output by the filter block 306 can form check signals.

These three effective value signals are input to the derivative block 308. In the derivative block 308, gradients are determined in each case for the effective value signals by differentiation or difference formation and these gradients are compared with a check limit in each case. In this embodiment, the presence of a low-frequency oscillation is assumed if it has been identified that the check limit of the voltage effective value signal $V_m$ is exceeded and also it has been identified that the check limit of at least one of the two remaining effective value signals, namely the active power effective value $P_m$ and the reactive power effective value $Q_m$ is exceeded in each case. Only then is the presence of a low-frequency oscillation assumed. It is of course also possible that all three signals which enter into the derivative block 308 here each exceed their check limit.

If this check criterion is therefore met, the derivative block 308 outputs a corresponding signal, which is referred to as a trigger signal here. The signal is therefore referred to as a trigger signal because it can be further used in order to trigger responses, i.e., for triggering. Such triggering responses can be the undertaking of damping measures and additionally or alternatively it can be a safety shutdown of the wind energy system which uses this method. It is also possible that the trigger signal is always output but that it has a different value or a different signal amplitude depending on the detected situation, i.e., depending on whether a low-frequency oscillation has been detected.

Figure 4:
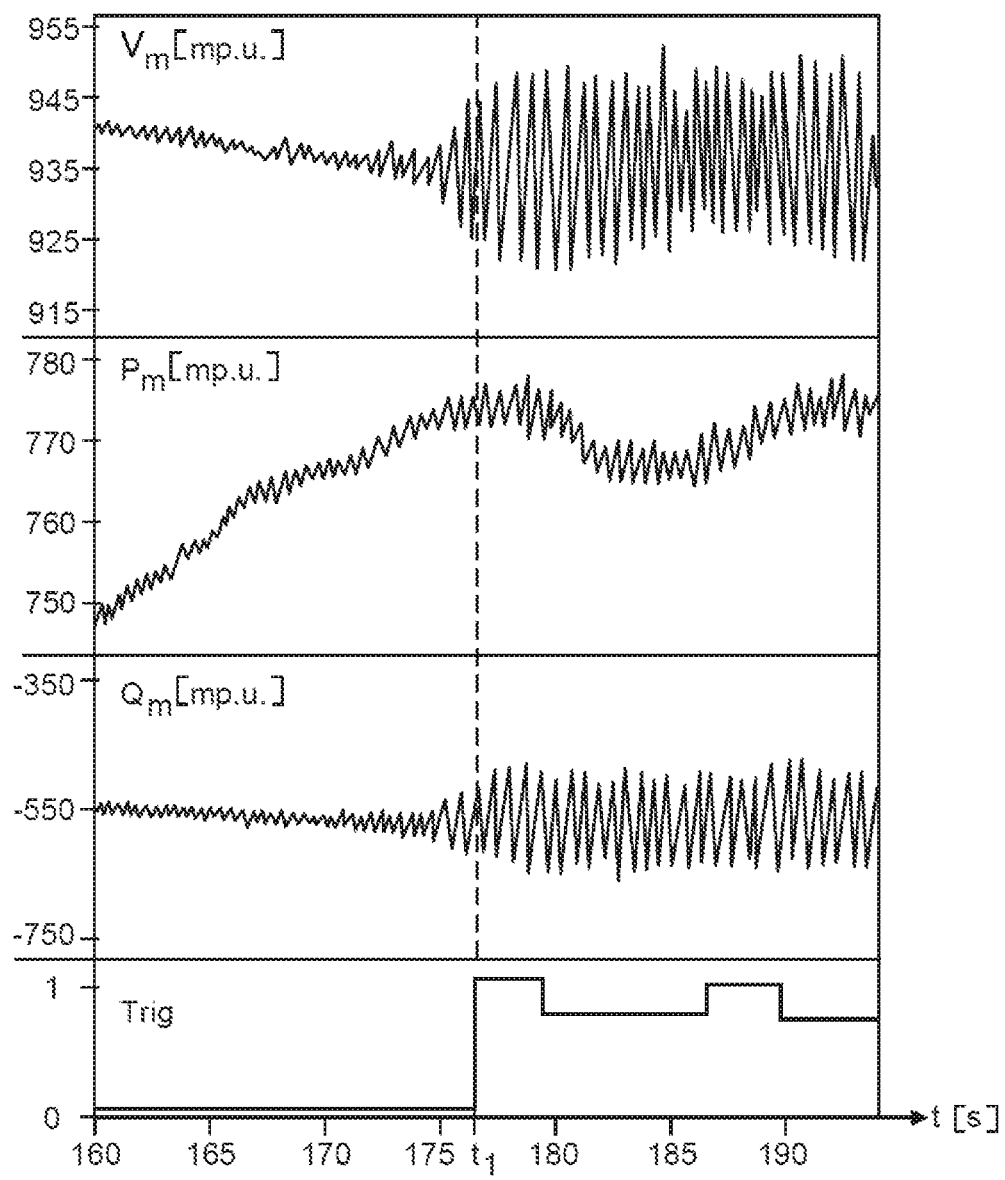
FIG. 4 shows a schematic diagram of a plurality of check signals.

FIG. 4 shows in a schematic diagram with measurements recorded over a period of approximately 30 seconds the course of three check signals, namely the voltage check signal $V_m$, the active power check signal $P_m$ and the reactive power check signal $Q_m$. These three check signals correspond to the three effective value signals $V_m$, $P_m$ and $Q_m$ according to FIG. 3, which the filter block 306 outputs there.

The diagram in FIG. 4 also shows a trigger signal that corresponds to the trigger signal $T_{rig}$ according to FIG. 3, that the derivative block 308 outputs there.

The three check signals $V_m$, $P_m$ and $Q_m$ are represented there in a standardized manner, that is to say standardized to nominal values. In this case, the numbers are represented as "milli", so that the scale ranges from −1000 to +1000, instead of −1 to +1. According to the proposed method, derivatives are also formed from these three check signals for further evaluation, particularly in the derivative block 308, before a further evaluation takes place. For the sake of simplicity, these derivatives are not represented here.

It can be recognized in FIG. 4 that all three check signals initially have few oscillations. The voltage check signal $V_m$ and the reactive power check signal $Q_m$ initially have approximately a constant value. Constant reactive power is therefore fed in. The voltage check signal $V_m$ drops slightly, wherein the drop is less than 1%.

The active power check signal indicates a slightly increasing value. This increase may also be a result of increasing wind speeds. However, the increase in 15 seconds by approximately 3% is comparatively low and in any case does not allow for any conclusion to be drawn regarding low-frequency oscillations.

Shortly before the time $t_1$, it can be recognized that all three check signals have increasing oscillations. The increase in oscillations appears obvious and easily recognizable in the graph of the schematic representation according to FIG. 4. However, this connection is not easily identifiable for an automatic evaluation by means of a process computer.

It is therefore proposed to make a derivative of these three check signals in each case, namely the voltage check signal $V_m$, the active power check signal $P_m$ and the reactive power check signal $Q_m$. The oscillations then emerge more strongly with such a derivative, which in any case is not represented in FIG. 4. The derivatives then become so large at the time $t_1$ that they exceed their respective check limit and the presence of a low-frequency oscillation has therefore been identified.

This is based on an evaluation which identifies the presence of a low-frequency oscillation if the voltage check signal and the reactive power check signal in each case exceed their check limit, and/or if the voltage check signal and the active power check signal in each case exceed their check limit. In the example in FIG. 4, both criteria are met at the time t1. For the sake of simplicity, the trigger signal $T_{rig}$ shows at the time $t_1$ that this is the case and the trigger signal $T_{rig}$ jumps from 0 to the value 1. If only one of the criteria is met, the trigger signal $T_{rig}$ assumes a smaller value, but which is significantly greater than zero, for example 0.8.

The trigger signal $T_{rig}$ only assumes the value 0 if none of the criteria is met. The trigger signal $T_{rig}$ therefore partially drops to this smaller value of approximately 0.8, because the active power check signal or the reactive power check signal have dropped below their check limit there in the temporal ranges. During the entire time represented from the time $t_1$, the voltage check signal has not dropped below its check limit, because in that case the trigger signal $T_{rig}$ would have dropped to the value 0.

If it does not assume the value 0, the trigger signal $T_{rig}$ can then result in a damping measure being initiated, or even a shutdown of a wind energy system taking place, or even the wind energy system being disconnected from the electrical supply network.

Figure 5:
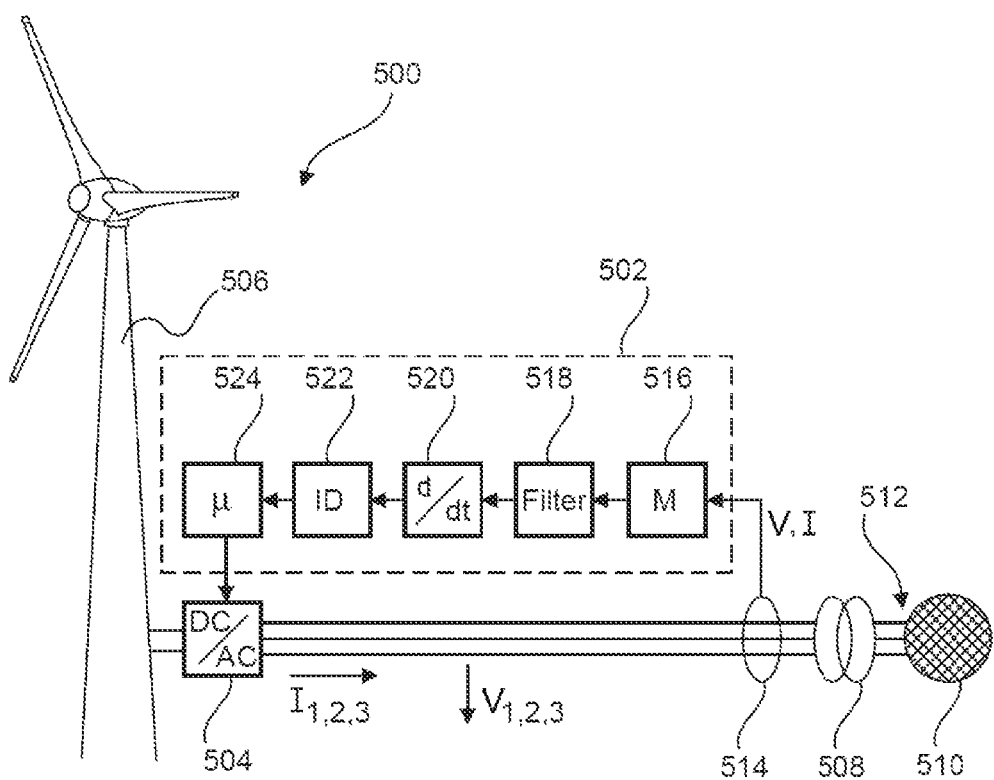
FIG. 5 shows a wind energy system with a control device.

FIG. 5 shows in an illustrative manner a wind power installation 500 with a control device (controller) 502, which is to be regarded as part of the wind power installation 500, precisely like the inverter 504 just shown, and could be arranged in the tower 506 of the wind power installation, wherein the inverter 504 and the control device are represented outside the remaining wind power installation 500 merely for the sake of clarity.

The inverter 504 receives power produced by the wind as a direct voltage signal and performs the inversion based on this and produces a three-phase feed current $I_{1,2,3}$ at a three-phase voltage $V_{1,2,3}$. This can be fed into the electrical supply network 510 at a network connection point 512 indicated there via a transformer 508.

In order to carry out a proposed method for identifying low-frequency oscillations, current and voltage can firstly be measured with an indicated measuring sensor (ammeter, voltmeter and/or multimeter) 514 and be transferred to the detection device 516. The detection device 516 and the measuring sensor 514 can also form a common unit (controller-sensor).

The detection device 516 therefore detects at least one test signal from the transferred measurements. Voltage and current can each form a test signal here. This test signal or here these test signals are then transferred to the filter unit (filter) 518, which carries out a filtering and in particular carries out this filtering in such a way that substantially only signal components with desired frequencies, that is to say in the range of the expected low-frequency oscillations, remain. These signals filtered in this way are used as check signals and transferred to the differentiation unit 520. The symbol of the differentiation unit 520 points to a time-continuous derivative, but a discrete derivative by way of difference formation is of course also possible particularly in the case of the presence of discrete signals.

In any case, the signal differentiation in this way or these signals differentiated in this way are transferred to the identification unit 522, which then checks a predetermined check criterion, in particular checks for each received differentiated check signal whether a predetermined check limit is exceeded in each case. The identification unit 522 can transfer a trigger signal to a process computer 524 as a result.

In principle, the process computer 524 controls the inverter, takes over further control tasks if applicable, and can also perform this control depending on the trigger signal received by the identification unit 522. Particularly if a low-frequency oscillation or a plurality of low-frequency oscillations have been identified, the process computer 524 can control the inverter 504 in a correspondingly modified manner by specifying a reduction in the power to be fed in, for example. For this purpose, the process computer 524 can additionally perform further controls in the wind power installation, something which is not shown in FIG. 5, such as adjusting the rotor blades, for example, in order to also extract less power from the wind accordingly.

Additionally or alternatively, it is possible that in the event of identified low-frequency oscillations, for protecting the wind power installation, feeding is suspended and, if applicable, a safety switch is opened, which in any case is not shown in FIG. 5 for the sake of simplicity.

In particular, a method for identifying low-frequency oscillations has therefore been proposed. This takes into account that energy systems are oscillatory systems which possess natural modes below and also possibly above the system frequency. The line frequency is to be assumed here as a system frequency, i.e., usually 50 Hz or 60 Hz. Oscillations of this type can affect system stability when excited.

Wind power installations can also contribute to the stabilization, or even to the destabilization in the case of incorrect handling, of the energy system. It should be noted that the lifespan of a wind power installation can be approximately 25 years, and the energy system can also change and develop significantly during this time.

For the observation of low-frequency oscillations now proposed, which oscillations are also referred to as energy system oscillations or power system oscillations (PSO), not only a warning system for the operation of wind power installations or wind farms can be used, but this information as a result of the observation can also be used, in order to use suitable damping signals through the wind farm or possibly through a wind power installation for damping the energy system oscillations.

The proposed method can also be implemented as an algorithm in a control device, in particular a process computer. In the case of a wind farm as a wind energy system, a central farm computer or a central farm control unit can also be considered for this purpose, on which the method can be implemented. In particular the detection device, filter unit, differentiation unit and identification unit, as illustrated in FIG. 5, can also be combined in a common control unit (controller), or they can be implemented as algorithms or software blocks.

The proposed algorithm or the proposed method is particularly based on the analysis of voltage and power gradients. Moreover, evaluations can be performed on site at the wind power installation, or in the wind farm, or even in a remote monitoring center. There is then the possibility that the required data is transmitted via SCADA for this purpose.

Moreover, the proposed method can also be applied for consumer units, and in principle also for conventional power stations. For example, in the event of identified low-frequency oscillations, consumer units can optionally change their behavior or optionally disconnect from the electrical supply network.

In particular, a solution is also provided which enables a method for online detection of energy system oscillations.

In particular, the method makes provision for an online analysis of transient measurement data at a network connection point of a wind farm. This is particularly advantageous because a central farm control unit is usually arranged there in wind farms. The analysis can therefore be performed immediately and on site. It is proposed that voltages and currents are evaluated, filtered in a suitable manner and that finally the calculation of the temporal gradients of the filtered voltage and calculated power signals takes place. Low-frequency oscillations can then be detected as a result of suitable parameterization of the check limits, which can also be referred to as a threshold value.

The invention claimed is:

1. A method for identifying low-frequency oscillations in an electrical supply network having a line voltage associated with a nominal line frequency, the method comprising:
   detecting at least one electrical signal of the electrical supply network as at least one test signal;
   filtering and/or transforming the at least one test signal into at least one check signal;
   obtaining a gradient signal by:
     temporally differentiating the at least one check signal, or
     obtaining a difference of temporally separated values of the at least one check signal;
   determining whether the gradient signal meets a predetermined criterion; and
   in response to determining that the gradient signal meets the predetermined criterion, identifying a presence of a low-frequency oscillation, wherein:
     transforming the at least one test signal into the at least one check signal includes transforming the line voltages of the electrical supply network in three phases and current fed into the electrical supply network in three phases into a voltage signal, an active power signal and a reactive power signal as a voltage check signal, an active power check signal or a reactive power check signal,
     temporally differentiating the at least one check signal includes temporally differentiating the voltage check signal, the active power check signal and the reactive power check signal to obtain a voltage gradient signal, an active power gradient signal and a reactive power gradient signal, respectively, or obtaining the difference of the temporally separated values of the at least one check signal includes obtaining a difference of temporally separated values of the voltage check signal, the active power check signal and the reactive power check signal to obtain the voltage gradient signal, the active power gradient signal and the reactive power gradient signal, respectively,
     the voltage gradient signal, the active power gradient signal and the reactive power gradient signal are checked for the presence of the low-frequency oscillation, and
     the presence of the low-frequency oscillation is identified in response to the low-frequency oscillation being found at least in the voltage gradient signal and the active power gradient signal or in the voltage gradient signal and the reactive power gradient signal.

2. The method as claimed in claim 1, wherein:
   the predetermined criterion is met in response to the gradient signal exceeding a gradient maximum value, and
   determining whether the gradient signal meets the predetermined criterion includes:
     determining whether the gradient signal exceeds the gradient maximum value at least once, or
     determining whether the gradient signal exceeds the gradient maximum value at least for a predetermined minimum period.

3. The method as claimed in claim 1, wherein obtaining the difference of temporally separated values of the at least one check signal includes obtaining a difference between a maximum and minimum value of the at least one check signal in a check period.

4. The method as claimed in claim 1, wherein:
   the at least one test signal is the line voltages of the electrical supply network in three phases,
   the at least one test signal is the current fed into the electrical supply network in three phases, or
   the at least one test signal is the line voltages of the electrical supply network in three phases and the current fed into the electrical supply network in three phases.

5. The method as claimed in claim 1, wherein obtaining the difference of the temporally separated values of the at least one check signal yields a plurality of gradient signals including the gradient signal.

6. The method as claimed in claim 1, comprising:
   detecting a line frequency of the electrical supply network as a further test signal or transforming the further test signal into a frequency signal as a frequency check signal;
   temporally differentiating or obtaining a difference of the frequency check signal to obtain a frequency gradient signal;
   checking the frequency gradient signal and at least one further gradient signal for the presence of the low-frequency oscillation, the at least one further gradient signal being one of: the voltage gradient signal, the active power gradient signal or the reactive power gradient signal; and
   identifying the presence of the low-frequency oscillation in response to the low-frequency oscillation being identified in the frequency gradient signal and in the at least one further gradient signal.

7. The method as claimed in claim 1, wherein detecting the at least one electrical signal of the electrical supply network includes at least one of:
   detecting a three-phase line voltage; and transforming the three-phase line voltage to produce a direct variable that is a space vector variable of the three-phase line voltage, transforming the three-phase line voltage including determining a positive sequence voltage according to the method of the symmetrical components to form a check signal; or
   detecting a three-phase feed current; and transforming the three-phase feed current to produce a direct variable that is a space vector variable of the three-phase line voltage, transforming the three-phase feed current including determining a positive sequence current according to the method of the symmetrical components to form the check signal.

8. The method as claimed in claim 7, wherein the direct variable of the three-phase line voltage or the positive sequence voltage and the direct variable of the three-phase feed current or the positive sequence current are transformed into a voltage signal, an active power signal and a reactive power signal as a voltage check signal, active power check signal or reactive power check signal, respectively.

9. The method as claimed in claim 1, comprising:
   feeding electrical power into the electrical supply network by a wind power installation or wind farm; and
   identifying the presence of the low-frequency by the wind power installation or wind farm.

10. The method as claimed in claim 1, comprising:
    identifying the low-frequency oscillation in the voltage gradient signal and the active power gradient signal or in the voltage gradient signal and the reactive power gradient signal;
    identifying that the low-frequency oscillation in the voltage gradient signal and the active power gradient signal or in the voltage gradient signal and the reactive power gradient signal has the same oscillation frequency or oscillates with the same frequency as the line frequency; and
    identifying that the low-frequency oscillation is caused in the electrical supply network.

11. The method as claimed in claim 10, comprising:
    determining the voltage gradient signal, active power gradient signal and reactive power gradient signal as a difference between a maximum value and minimum value in a check period of a corresponding check signal; and
    determining the same oscillation frequency in the check period or determining that respective time intervals between the maximum value and the minimum value of the corresponding check signal are the same for the voltage gradient signal, the active power gradient signal or the reactive power gradient signal.

12. The method as claimed in claim 1, comprising:
    determining a gradient quotient as a quotient of two gradient signals; and
    identifying that the low-frequency oscillation is caused in the electrical supply network depending on the gradient quotient, wherein the gradient quotient is one of:
       a voltage and active power quotient formed as a quotient between the voltage gradient signal and the active power gradient signal, or
       a voltage and reactive power quotient formed as a quotient between the voltage gradient signal and the reactive power gradient signal.

13. The method as claimed in claim 12, comprising:
    identifying that the low-frequency oscillation is caused in the electrical supply network in response to the voltage and active power quotient or the voltage and reactive power quotient being negative.

14. The method as claimed in claim 1, comprising:
    identifying a decay of the low-frequency oscillation or a plurality of low-frequency oscillations in response to the gradient signal or respective gradient signals falling below a predetermined termination limit that is less than a check limit of the predetermined criterion.

15. The method as claimed in claim 1, comprising:
    classifying the low-frequency oscillation; and
    outputting an oscillation classification of the low-frequency oscillation, wherein the oscillation classification is selected from a list of classifications including:
       a low-frequency oscillation identified for a line voltage signal and the active power signal;
       a low-frequency oscillation identified for the line voltage signal and the reactive power signal;
       a low-frequency oscillation identified for the line voltage signal, the active power signal and the reactive power signal; and
       a low-frequency oscillation identified for a line frequency and at least one of the line voltage signal, the active power signal or the reactive power signal.

16. The method as claimed in claim 1, wherein the low-frequency oscillations are sub synchronous resonances.

17. The method as claimed in claim 1, wherein the low-frequency oscillation has a frequency between 1 Hz and five times the nominal line frequency.

18. The method as claimed in claim 1, wherein the predetermined criterion is met when the gradient signal exceeds at least one predetermined limit.

19. A wind power installation or wind farm including a plurality of wind power installations configured to identify low-frequency oscillations in an electrical supply network having a line voltage associated with a nominal line frequency, the wind power installation or wind farm comprising:
    a controller configured to:
       detect at least one electrical signal of the electrical supply network as at least one test signal;
       filter and/or transform the at least one test signal into at least one check signal;
       temporally differentiate the at least one check signal or determine a difference between temporally separated values of the at least one check signal to obtain a gradient signal; and
       identify a presence of a low-frequency oscillation in response to the gradient signal meeting a predetermined criterion, wherein:
          transforming the at least one test signal into the at least one check signal includes transforming line voltages of the electrical supply network in three phases and current fed into the electrical supply network in three phases into a voltage signal, an active power signal and a reactive power signal as a voltage check signal, an active power check signal or a reactive power check signal,
          temporally differentiating the at least one check signal includes temporally differentiating the voltage check signal, the active power check signal and the reactive power check signal to obtain a voltage gradient signal, an active power gradient signal and a reactive power gradient signal, respectively, or determining the difference between the temporally separated values of the at least one check signal includes obtaining a difference of temporally separated values of the voltage check signal, the active power check signal and the reactive power check signal to obtain the voltage gradient signal, the active power gradient signal and the reactive power gradient signal, respectively, the voltage gradient signal, the active power gradient signal and the reactive power gradient signal are checked for the presence of the low-frequency oscillation, and the presence of the low-frequency oscillation is identified in response to the low-frequency oscillation being found at least in the voltage gradient signal and the active power gradient signal or in the voltage gradient signal and the reactive power gradient signal.

* * * * *

UNITED STATES PATENT AND TRADEMARK OFFICE
CERTIFICATE OF CORRECTION

| | |
|---|---|
| PATENT NO. | : 11,658,490 B2 |
| APPLICATION NO. | : 17/258130 |
| DATED | : May 23, 2023 |
| INVENTOR(S) | : Kai Busker et al. |

It is certified that error appears in the above-identified patent and that said Letters Patent is hereby corrected as shown below:

In the Claims

Column 19, Claim 7, Line 6:
"line voltage; and transforming" should read: --line voltage and transforming--.

Column 19, Claim 7, Line 13:
"feed current; and transforming" should read: --feed current and transforming--.

Column 19, Claim 9, Line 31:
"of the low-frequency by the wind" should read: --of the low-frequency oscillation by the wind--.

Column 20, Claim 16, Line 31:
"oscillations are sub synchronous" should read: --oscillations are subsynchronous--.

Signed and Sealed this
Eighteenth Day of February, 2025

Coke Morgan Stewart
*Acting Director of the United States Patent and Trademark Office*